US006927487B2

United States Patent
Gebauer et al.

(10) Patent No.: US 6,927,487 B2
(45) Date of Patent: Aug. 9, 2005

(54) PROTECTIVE DEVICE WITH SPACER FOR SUBASSEMBLIES

(75) Inventors: Uta Gebauer, München (DE); Volker Strutz, Tegernheim (DE)

(73) Assignee: Infineon Technologies AG, Munich (DE)

( * ) Notice: Subject to any disclaimer, the term of this patent is extended or adjusted under 35 U.S.C. 154(b) by 52 days.

(21) Appl. No.: 10/210,666

(22) Filed: Aug. 1, 2002

(65) Prior Publication Data

US 2003/0025194 A1 Feb. 6, 2003

(30) Foreign Application Priority Data

Aug. 1, 2001 (DE) .......................................... 101 37 667

(51) Int. Cl.⁷ .............................................. H01L 23/12
(52) U.S. Cl. ...................... 257/704; 257/707; 257/710; 257/738; 257/778; 257/779
(58) Field of Search ................. 257/684, 704, 257/707, 710, 738, 778, 779

(56) References Cited

U.S. PATENT DOCUMENTS 5,777,847 A * 7/1998 Tokuno et al. .............. 361/705

6,268,236 B1 7/2001 Miyawaki
6,294,408 B1 * 9/2001 Edwards et al. ............ 438/121

FOREIGN PATENT DOCUMENTS

| DE | 37 01 310 A1 | 7/1988 |
| DE | 198 06 017 A1 | 9/1998 |
| EP | 1 093 159 A1 | 4/2001 |
| JP | 2000 299 396 A | 10/2000 |

OTHER PUBLICATIONS

Author not listed: "Functional Island Attachment to Molded Card", IBM Corp., vol. 32, No. 4B, Sep. 1989, p. 138.

* cited by examiner

*Primary Examiner*—Thien F Tran
(74) *Attorney, Agent, or Firm*—Laurence A. Greenberg; Werner H. Stemer; Ralph E. Locher

(57) ABSTRACT

A protective device is provided for subassemblies having a substrate and a component disposed thereon and needing to be protected. The component typically is a semiconductor component. The protective device includes a covering element, a spacer, and a guide. The covering element covers a subassembly. The spacer is disposed between the covering element and the substrate for maintaining a predefined spacing between the covering element and the component to be protected in the area of the spacer. The guide is used for fixing a free end of the spacer to the covering element and/or to the substrate in a predefined X and/or Y position.

16 Claims, 1 Drawing Sheet

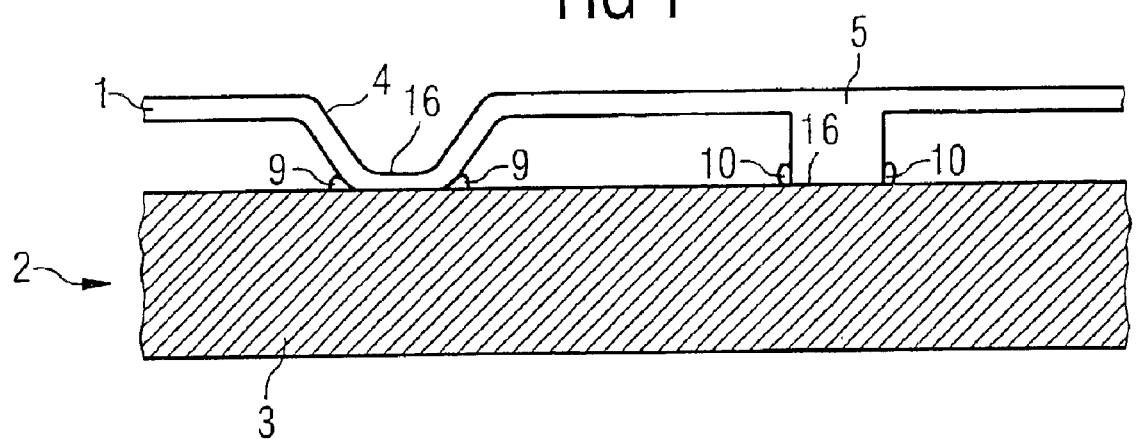
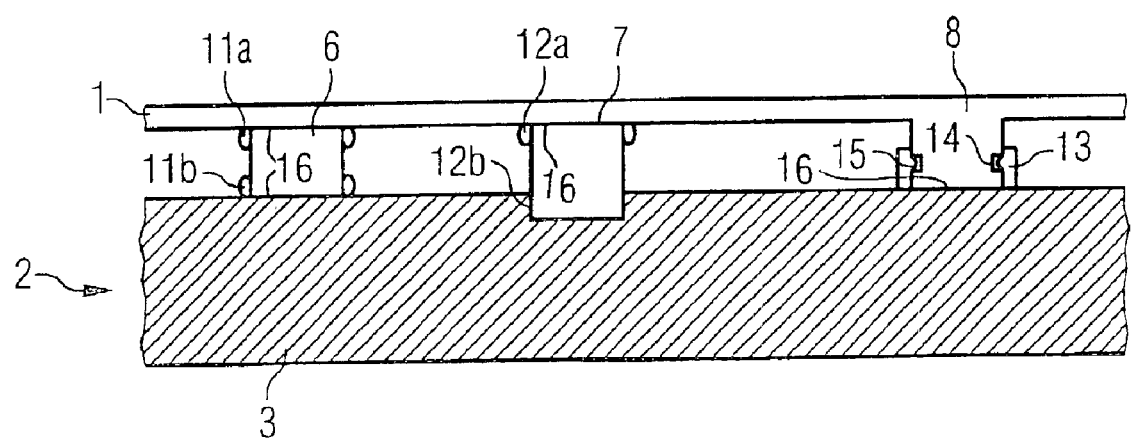

PROTECTIVE DEVICE WITH SPACER FOR SUBASSEMBLIES

BACKGROUND OF THE INVENTION

Field of the Invention

The present invention relates to a protective device for subassemblies, for example subassemblies having electronic components.

Integrated semiconductor circuit known as "chips" are generally platelets based on-silicon or gallium arsenite and cut out of a wafer with electric components produced photolithographically or by similar methods on their surface. In the use of integrated semiconductor circuits, the question of effective protection against mechanical and/or chemical influences is often posed. This question is often answered by introducing the chip into a housing, normally produced from plastic. However, a weak point in the chip mounting lies in the reaction of the electrical contacts between chip and a substrate accommodating the chip, such as a circuit board, to the action of forces on the chip. In the event of displacement of the component or else in the event of direct action on the contact elements, the latter can be damaged. As a result of the use of housings, the problem is merely displaced from the actual chip contacts (for example thin wires or contact elements similar to balls and ball-grid arrays) to the contacts of the housing, even though the latter can normally be more highly loaded mechanically. In principle, however, the contact elements still have too low a resistance against forces acting on the component (i.e., the chip).

In recent times, reasons regarding fabrication, space, and economy, manufacturing increasingly utilizes "flip-chips". Flip chips are integrated semiconductors fixed directly to the substrate, i.e., the circuit board, without a housing and contacted electrically. For this purpose, the individual chips still in the wafer composite are provided with suitable flexible contacts and, after the wafer has been cut, are placed on the substrate with the contact side down. In order to permit testing of the flip-chips before they are used, customary test devices are used. In order to be able to use such test devices on the wafer, the contacts have to be constructed to be sufficiently compliant that they are able to compensate for tilting between the surface of the wafer in the area of the flip-chip to be tested and the test device. However, after the flip-chip has been mounted on the substrate, this necessary compliance leads to corresponding mechanical sensitivity and to an increased need for protective measures.

A further development in recent times has been microcircuit boards, as they are known, in which a plurality of chips are applied to the microcircuit board substrate with the structured sides upward and are connected to the conductor track structures of the microcircuit boards by wire bonding. Here too, protection of the chips and in particular of the contact wires as well against mechanical effects is desirable.

Conventional fixings utilize a mechanical protective element such as a covering placed onto a substrate, for example, a rivet. The tolerances of the substrate, the receiving holes for the rivets, and the protective element allow movements of the protective element in the X and Y direction after mounting. Movements in the X and Y direction mean parallel to the plane of the substrate. However, in microelectronics, the dimensions of the components are preferably reduced. For this reason, the underside of the coverings comes closer and closer to the actual chip. Bringing them closer can lead to the mechanical problems described above. In particular, this can lead to damage to the component in the case of sensitive components with flexible interconnect elements.

Such a protective element is generally also used as a heat spreader. Here, the components located underneath, for example semiconductor components, are coupled mechanically and thermally by a thermally conductive material. The material is known in the art as the "gap filler" of the protective element. A gap filler can include silicon, for example, and can contain a proportion of metals or metal oxides. As a result, movement of the "heat spreader" is transmitted directly to the components. Excessive movement of the protective element can damage the electrical connections and can lead to failure of components. As result of the often low inherent stiffness of the protective element, protection of the components located underneath against compression in the Z direction, that is to say perpendicular to the plane of the substrate, is likewise not ensured.

The prior art proposes a solution to the problem of the unintentional movement of the protective element. According to one solution, the protective element is joined to the substrate by very accurately fitting riveted connections. This has the disadvantage that the selection of suitable rivets is very restricted and/or a high degree of accuracy of substrate and covering is required. Other fixing variants that could ensure good fixing often cannot be implemented because of the dimensional relationships of a subassembly or the surroundings into which this subassembly is to be integrated.

A further possibility is to bond the covering adhesively to the substrate. However, this results in an additional process step and therefore increases the costs. Compression protection in the Z direction has hitherto not been carried out or only by supporting the components in the Z direction. An example of supporting the components is adding a full or partial underfill under the components. Such an underfill projects under the components, requires a great deal of work, and is subject to faults.

SUMMARY OF THE INVENTION

It is accordingly an object of the invention to provide a protective device with a spacer for subassemblies that overcomes the hereinafore-mentioned disadvantages of the heretofore-known devices of this general type and that prevents displacement of the covering in the X and/or Y direction, but preferably also in the Z direction, or at least reduces movement to prevent damage to the contacts or to the components.

With the foregoing and other objects in view, there is provided, in accordance with the invention, a protective device for subassemblies having a substrate whose surface defines an X-Y plane, and a component to be protected disposed on the surface. The protective device includes a covering element, a spacer, and a guide. The covering element covers a subassembly. The spacer has a free end and is disposed near the component to be protected and between the covering element and the substrate in order to maintain a predefined spacing between the covering element and the component. "A spacer near the component" means at least close enough to the component to prevent the covering element from contacting the component. The guide fixes the free end of the spacer in a predefined position in the X-Y plane to at least one of the covering element and the substrate.

In this case a subassembly is to be understood to mean an end product of a configuration including a substrate and one or more functional components. A substrate can be a circuit board made of polymers in the conventional sense, but also a ceramic or metal support on which the components are placed, for example semiconductor components such as integrated circuits or passive components such as resistors, coils, etc.

The components to be protected can be of an extremely wide nature. For example, they can be electromechanical or purely mechanical components. One important area of use for the present invention will be in the area of electronics and semiconductor technology, where integrated circuits having a large number of contacts led to the outside requiring protection. It is therefore preferred in particular for the at least one component to be protected to be a circuit component connected to electrical contacts, in particular a semiconductor component. Here, a circuit component is to be understood to mean any integrated circuit with contacts, be it a housed or unhoused chip. Passive components can also come under the term circuit components, if they need protection. In addition, the substrate can have conductor tracks or structures like conductor tracks in order to carry electric currents away from the circuit components, if the contacts of various circuit components are alternatively not directly connected to one another, for example by using wire bonds.

A covering element in the sense of the present invention is, for example, an element known from the prior art that covers the subassembly in the manner of a cover. Such covering elements, which are also designated protective elements, are often also used as heat spreaders, in that a thermally conductive material, the gap filler as it is known, is introduced between those semiconductor components that require dissipation of heat and the covering element or protective element produced from metal.

For the configuration of the spacer used according to the invention between covering element and substrate, various possibilities are available. For example, the at least one spacer can be a molding on the covering element that curves forward in the direction of the substrate. In this case, the spacer is therefore constructed in one piece with the remainder of the covering element and, in the event of production from plastic, can be produced in a simple way by injection molding, for example. If the spacer is produced from a metal, the spacer can be milled freely, for example, or a spacer is welded on or fitted in another way to the covering element, for example by adhesive bonding or screwing. In these cases, the molding therefore constitutes a thickening in the covering element. It is also possible for the molding in the covering element to be an indentation that curves forward in the direction of the substrate when the covering element is in the mounted position. Here, too, depending on the material used, there are different fabrication possibilities available. In this case, the spacer will normally include a substantially plate-like material, which is likewise used for the covering element, so that the spacer and the rest of the covering element each have substantially the same material thickness. The spacer must be dimensioned such that, after the covering element has been mounted, it contacts the guide and can be fixed by the latter.

The spacer can also be a separate component, which is then fixed both to the substrate and to the covering element by guides. Finally, the spacer can also be fixed to the substrate or constructed in one piece with the substrate, for example by appropriate projections in the case of ceramic substrates. The spacer can also be adhesively bonded or, if appropriate, welded to the substrate.

Depending on the intended use, the spacer can be molded differently. For example, it can be constructed in the manner of a web, for example being positioned in the form of a square profile between substrate and covering element. It can also be cylindrical and can then be disposed upright between substrate and covering element. Here, a cylindrical element is to be understood in the widest sense as any molding that appears substantially round in a plan view of the substrate, that is to say circular cylinders but also elliptical cylinders, oval cylinders, or cylinders with four rounded corners.

The guide and spacer must be matched to each other in order to allow play of the spacer in the guide in the X/Y direction only up to a predefined extent, which still prevents mechanical action on the components to be protected. The guide should therefore engage around the spacer by a form locking connection after being mounted. A form-locking connection is one that connects two elements together due to the shape of the elements themselves, as opposed to a force-locking connection, which locks the elements together by force external to the elements. Depending on the configuration, it is sufficient for the guide to fix the spacer only in one direction and to leave it free in the other direction, for example when a plurality of spacers are disposed between substrate and covering element and extend in different preferential directions, and the associated guides are likewise oriented in different directions, so that fixing a spacer at the same time leads to the covering element and a spacer likewise disposed thereon in another direction likewise no longer being displaceable in the first direction. In the practical configuration of spacer(s) and associated guides, numerous possibilities are available, the practical configuration also depending on the requirements to be implemented in each case.

Various possibilities are again available for the configuration of the guide. For example, in a preferred embodiment of the invention, the guide can be a depression in the substrate and/or the covering element, in which the spacer can engage. In such an embodiment, the spacer must have dimensions such that not only is the spacing between covering element and substrate bridged but also the depth of the respective guide down to its base.

In a further embodiment, the guide can have two guide rails that run in parallel, between which a web-like spacer is fitted. Therefore, the guide rails lie on the surface of the substrate or the covering element and should have a shape that permits secure fixing of the spacer inserted between them.

At least one guide for the spacer can be disposed on the substrate. It is likewise possible for at least one guide for the spacer to be disposed on the covering element, or for the spacer to be fixed on both sides by guides.

In a preferred embodiment of the invention, a plurality of spacers is disposed in such a way that the predefined position of the covering element can be maintained over its entire surface. The various spacers positioned at different locations are therefore used in this preferred embodiment of the invention for the cooperative fixing of the covering element over its entire surface. The practical positioning of the individual covering elements and of the associated guides in this case also depends on the physical conditions of the substrate, of the covering element and the various components, such as the semiconductor components on the substrate.

Likewise, a proportion of the spacers can be fixed to the substrate and a second proportion of the spacers to the covering element, so that guides must be provided both on the covering element and on the substrate for those spacers that in each case are fixed to the other of the two elements including covering element and substrate. It is also possible to combine spacers, which are fixed either to the substrate or to the covering element, with those which are inserted loosely into the guides and are therefore fixed neither to the covering element nor to the substrate.

The protective device according to the invention can also be characterized by complementary compatible latching elements are disposed on the covering element and the guide. After latching, they oppose a predefined force required for removal of the covering element from the subassembly. In this way, fixing in the Z direction may additionally be achieved, so that either further fixing, for example via rivets, is not necessary or their fitting is made easier by the prior retention of the covering element. Such a latching device can be achieved, for example, by grooves in the spacer that run parallel to the surface of the substrate and can engage in appropriately shaped bulges in the guides.

Furthermore, the protective device according to the invention can include a gap filler that is disposed between the covering elements and at least one component to be protected. The gap filler fulfills the functions already known in the prior art, for example the diffusion of heat from the components to be protected to the covering element, which then also serves as a heat spreader. The gap filler is a plastic compound like silicon that exhibits good thermal conductivity as a result of the admixture of metal or metal oxide particles or the like and that dissipates the heat developed by the current flowing in semiconductor components to the covering element. As already explained above, such covering elements often additionally contribute to the dissipation of heat: hence the name "heat spreaders".

The components that can be protected with the invention can in principle be all components that are known in the prior art or are novel, provided they need appropriate protection, in particular in an X/Y direction, that is to say parallel to the substrate surface. For example, the at least one component can be a housed component or a flip-chip.

Furthermore, the protective device according to the invention can include fixing elements with which the covering element is fixed to the substrate. These fixing elements preferably can be rivets. However, because of the measure according to the invention, in this case it is also possible to use more cost-effective rivets that have a lower fitting accuracy than the rivets needed hitherto in order to achieve reliable protection.

The substrate can have any form known in the prior art. The substrate is preferably a circuit board with contact points to make contact with semiconductor components to be protected. However, it can also be a microcircuit board or a ceramic carrier for corresponding elements. The contact points normally will lie on the circuit board or microcircuit board. However, the invention also encompasses direct wire connections between different semiconductor components, with the substrate merely serving as a mechanical holder for the various semiconductor components. In this case, the invention is primarily directed to the protection of these wiring elements, since they constitute the most sensitive part of the subassembly to be protected. In particular, the substrate can be a circuit board having conductor tracks and contacts for connection to the at least one semiconductor component.

Other features that are considered as characteristic for the invention are set forth in the appended claims.

Although the invention is illustrated and described herein as embodied in a protective device with a spacer for subassemblies, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic sectional view showing an embodiment of a protective device according to the invention in which the spacers are moldings on a covering element; and FIG. 2 is a diagrammatic sectional view showing an autonomous spacer fixed to guides, the covering element, and the substrate.

DESCRIPTION OF THE PREFERRED EMBODIMENTS

Referring now to the figures of the drawings in detail and first, particularly to FIG. 1 thereof, there is shown, by way of example, various configurations of the spacer used in accordance with the invention. The illustration shows a subassembly 2 with a substrate 3 that is intended to be protected by a covering element 1 in such a way that semiconductor components disposed on the substrate can neither be destroyed nor have their contacts interrupted. In order to prevent the covering element being placed on semiconductor components, which have not been illustrated, spacers 4 and 5 are provided. In this case, the spacer 4 is an indentation in the material of the covering element 1, which can be produced by embossing or the like, for example, and is distinguished by the same material thickness as the rest of the covering element. The spacer 5 is an element with a substantially square cross section, which is either produced in one piece with the covering element 1 or is fixed to the covering element 1, for example by welding, adhesive bonding, or screwing. After a free end 16 of the spacer has engaged the guides 9 and 10, the latter limit displacement orthogonal to their preferential direction, that is to say in this case to the right or left in the drawing. While the guide 9 that fixes the spacer 4 has a curved surface in the present invention, the guide 10 for the spacer 5 has a cross section with edges. Of course, intermediate and mixed forms of these guides are possible.

FIG. 2 shows a further exemplary embodiment of the present invention, in which substrate 3 and covering element 1 are spaced apart from each other amongst other things by a spacer 6 which, as an individual element, is fixed neither to the substrate 3 nor to the covering element 1 and accordingly needs both a guide 11a on the covering element 1 and a guide 11b on the substrate 3. In this way, it is also possible to prevent displacement in the direction of the guides between the substrate 3 and the covering element 1.

A spacer 7 shows a further embodiment of the present invention. In this embodiment, the guide 12a corresponds to the guide 11a of the spacer 6, apart from its cross section being configured in another way, while the guide 12b is constructed as a depression in the substrate.

FIG. 2 finally shows a third embodiment of a spacer. The spacer 8 fixed to the covering element 1 is fixed in guides 13. The guides 13 have projections 15 extending therefrom. The projections 15 engage in corresponding grooves 14 formed in the spacer 8. Projections 15 and grooves 14 therefore form the latching elements according to the invention that prevent inadvertent detachment of the covering element 1 from the subassembly 2.

In addition to the guides, the spacer 6 can also be fixed by adhesive areas, which have not been illustrated.

In the cross-sectional illustration in FIGS. 1 and 2, of course only one direction and its fixing by guides can be illustrated. However, in an actual three-dimensional construction, the guides can surround the spacers on all sides and therefore permit fixing both in the X direction and in the Y direction.

It will therefore be possible to continue fixing the mechanical protective element or the covering element to the substrate by known fastening methods, but these can permit greater play in the X/Y direction. Avoiding a movement in the X/Y direction is carried out in the invention by using at least one guide on the substrate or the protective element side. As shown, for this purpose a spacer has to be fitted between substrate and covering element or fixed to the opposing piece by suitable moldings of substrate or covering element and a guide implemented in accordance with the invention.

We claim:

1. A protective device for subassemblies having a substrate with a surface defining an X-Y plane, and a component to be protected being disposed on the substrate, the protective device comprising:

a covering element for covering a subassembly;

a spacer having a free end and being disposed near the component to be protected and between said covering element and the substrate in order to maintain a predefined spacing between said covering element and the component to be protected;

a guide for fixing said free end of said spacer in a predefined position in the X-Y plane to at least one of said covering element and the substrate, said guide including a guide rail engaging said spacer; and complementary compatible latching elements disposed on said covering element and said guide and opposing a predefined force required for removal of said covering element from said subassembly after latching therein.

2. The protective device according to claim 1, wherein said spacer is fixed to the substrate.

3. The protective device according to claim 1, wherein said spacer is fixed to said covering element.

4. The protective device according to claim 1, wherein said spacer is shaped like a web.

5. The protective device according to claim 1, wherein said spacer is cylindrical.

6. The protective device according to claim 1, wherein said spacer is formed from a material identical to said covering element.

7. The protective device as claimed in claim 1, wherein:

said guide includes two parallel guide rails; and said spacer is web-like and fits between said parallel guide rails.

8. The protective device according to claim 1, wherein said guide for said spacer is disposed on the substrate.

9. The protective device according to claim 1, wherein said guide for said spacer is disposed on said covering element.

10. The protective device according to claim 1, further comprising a further spacer maintaining the predefined spacing of the covering element throughout the surface.

11. The protective device according to claim 1, further comprising fixing elements for fixing said covering element to the substrate.

12. The protective device according to claim 1, wherein the component to be protected is a circuit component connected to electrical contacts.

13. The protective device according to claim 12, wherein the circuit component is a semiconductor component.

14. The protective device according to claim 13, wherein said semiconductor component is a housed component.

15. The protective device according to claim 13, wherein said semiconductor component is a flip-chip.

16. The protective device according to claim 13, wherein the substrate is a circuit board having conductor tracks and contacts for connection to said semiconductor component.

* * * * *